United States Patent
Leerkamp et al.

(10) Patent No.: US 7,089,646 B2
(45) Date of Patent: Aug. 15, 2006

(54) METHODS OF MANUFACTURING A PRINTED CIRCUIT BOARD SHIELDED AGAINST INTERFERING RADIATION

(75) Inventors: Peter Leerkamp, Boxmeer (NL); Stephanus Gerardus Blankenborg, Nijmegen (NL)

(73) Assignee: Stork Prints B.V., Boxmeer (NL)

( * ) Notice: Subject to any disclaimer, the term of this patent is extended or adjusted under 35 U.S.C. 154(b) by 0 days.

(21) Appl. No.: 10/398,497

(22) PCT Filed: Oct. 3, 2001

(86) PCT No.: PCT/NL01/00727

§ 371 (c)(1),
(2), (4) Date: Jul. 10, 2003

(87) PCT Pub. No.: WO02/30170

PCT Pub. Date: Apr. 11, 2002

(65) Prior Publication Data
US 2004/0022046 A1 Feb. 5, 2004

(51) Int. Cl.
*H05K 9/00* (2006.01)
(52) U.S. Cl. .................. 29/592.1; 174/373; 174/377
(58) Field of Classification Search .............. 174/35 R, 174/35 GC; 361/816, 818; 228/180.21, 228/179.1; 29/830, 832, 592.1
See application file for complete search history.

(56) References Cited

U.S. PATENT DOCUMENTS 4,838,475 A * 6/1989 Mullins et al. .......... 228/179.1
5,313,371 A   5/1994 Knecht et al. ............. 361/818
5,703,761 A * 12/1997 Heiss ........................ 361/800
5,704,117 A * 1/1998 Mok et al. .................. 29/841
6,130,592 A * 10/2000 Okihara ...................... 335/202
6,175,077 B1 * 1/2001 Mendolia et al. ......... 174/35 R
6,218,610 B1 * 4/2001 Suzuki .................... 174/35 R
6,624,432 B1 * 9/2003 Gabower et al. ........ 250/515.1

FOREIGN PATENT DOCUMENTS

| EP | 0806891 A1 | 11/1997 |
| EP | 0806892 A1 | 11/1997 |
| JP | 05136593 | * 1/1993 |
| WO | WO 98/47340 | 10/1998 |
| WO | WO 99/40770 | 8/1999 |
| WO | WO 00/48441 | 8/2000 |

* cited by examiner

*Primary Examiner*—Hung V. Ngo
(74) *Attorney, Agent, or Firm*—Hoffmann & Baron, LLP

(57) ABSTRACT

Methods for the production of a board (11) with printed circuit (12) shielded against interfering radiation and having electronic components (14) comprise the steps of positioning of the electronic components (14) on contact points (15) designed for them, and the application of a shield (20), comprising a preformed metallized plastic film (30) over the top of the electronic components (14) and in electrical contact with the earth (13) on the board (11) with printed circuit (12), and also fixing the electronic components (14) on the board (11) with printed circuit (12) by means of an electrically conducting fixing agent (16); and fixing of the shield (20) on the board (11) with printed circuit (12).

7 Claims, 5 Drawing Sheets

METHODS OF MANUFACTURING A PRINTED CIRCUIT BOARD SHIELDED AGAINST INTERFERING RADIATION

CROSS-REFERENCE TO RELATED APPLICATIONS

This application is the national stage filing under 35 U.S.C. §371 of PCT/NL01/00727, filed Oct. 3, 2001, which claims priority to NL 1016549, filed Nov. 6, 2000; and NL 1016354, filed Oct. 6, 2000, both of which are incorporated herein by reference.

BACKGROUND OF THE INVENTION

The present invention relates to a method for the production of a board with printed circuit (printed circuit board) shielded against interfering radiation and having at least one electronic component.

It is customary for an electronic device to be protected, either in order to protect the electronic device itself against interfering radiation coming from an external source or in order to protect the environment against radiation generated by the electronic device itself.

Electronic devices which may be sensitive to interfering radiation, such as electromagnetic radiation, are electronic regulating, control and switching devices, and likewise communications equipment and data processing equipment, comprising one or more boards having a circuit on them and provided with electronic components, which circuit comprises a network of electrical conductors. Examples of such devices comprise, for example, microdata processors, computers, integrated circuits, microswitches, mobile telephones, transmitting and receiving equipment, pagers, television and so forth.

The term "shielding" is used in the art when referring to such protection of electronic equipment. The requirements which the abovementioned devices have to meet as regards such protection are becoming increasingly strict, and to an increasing extent are being laid down at international level.

Suitable shielding materials are generally composed of materials with good electrical and/or magnetic conducting properties, and are consequently often composed of metal. Examples of such shielding are metal casings or plastic coverings provided with a thin metal layer and generally applied to the inside of a housing. Various techniques are known for the application of such a metal layer directly to the inside of a housing or to a thin plastic film. Examples are metal painting, electroless plating, electroplating, vapour deposition and sputtering. In addition to these often complex, and therefore expensive techniques, in-mould foiling is a known process, in which either a metallized plastic film is deformed in a mould, for example by deep drawing, or a previously deformed metallized plastic film is placed in a mould, and in both cases a molten resin is subsequently poured into the mould, in order to place a carrier against the deformed metallized plastic film. Said carrier is often the housing or a part of the housing. This technique and the shielding materials used in it are described in, for example, WO99/40770 of the applicant.

EP-A-0,806,892 also discloses a production method, in which a shield is used, which shield consists of a plastic substrate which is first deformed and then metallized. Such a metallization of an already deformed plastic substrate is, however, difficult to carry out. The shield is fixed by means of conducting adhesive tape to an earth track of a board with printed circuit.

Although some of the abovementioned techniques provide good shielding results, there is a need among manufacturers of the abovementioned electronic equipment for simple shielding techniques, in particular for techniques that can be used by the manufacturer himself during the assembly of the electronic equipment.

SUMMARY OF THE INVENTION

The present invention provides such techniques.

According to a first aspect of the invention, to that end the method for the production of a board with printed circuit shielded against interfering radiation and having at least one electronic component comprises the steps of a) the application of flowable electrically conducting fixing agent to contact points for the at least one electronic component on the board with printed circuit and to the earth for the shield;

b) the positioning of the at least one electronic component on the contact points concerned of the board with printed circuit;

c) the positioning of a shield, comprising a preformed metallized plastic film, over the top of the electronic component on the earth of the board with printed circuit; and d) the simultaneous fixing of the at least one electronic component on the contact points and the shield on the earth by increasing the temperature to above the flowing point of the flowable electrically conducting fixing agent.

In the case of this method according to the invention, a flowable electrically conducting fixing agent, such as solder or conducting polymer, for example in solid form, is first applied to the contact points and to an earth track. For the shielding, the flowable fixing agent can advantageously be applied in the form of a so-called microball grid array. The contact points are in communication with the printed circuit (network of electrical conductors). The one or more electronic components are then placed, and the shield is subsequently placed over the top of the electronic components. The temperature is then increased to above the flow temperature of the fixing agent. In the case of soldering paste such a temperature increase can be carried out, for example, in an oven by heating to 260° C. or more, depending on the type of soldering paste used. The preformed shield retains its shape here. When the fixing agent has flowed sufficiently, the entire unit is allowed to cool down, so that solidification of the fixing agent can take place and both the shield and the electronic components are thereby firmly fixed on the PCB. The result of this is that both the electronic components and the shield are fixed on the PCB in one step, instead of being fixed in successive individual steps.

In the case of this method the shield is composed of a plastic film, which is moulded to the desired shape after metallization. After fixing of the shield, the latter is in electrical contact with a separate earth track of the PCB. This, as it were, forms a Faraday cage. These steps of this process are relatively simple and can easily be carried out by the manufacturer himself and integrated in existing production lines using already existing equipment. In addition, the shape of the shield can be kept relatively simple, and therefore so can the process for deformation of the metallized plastic film. This also gives an advantage compared with a shield comprising a preformed and subsequently metallized plastic substrate, such as, for example, according to EP-A-0,806,892. A simpler form of the ultimate shield also gives the advantage that the chance of interruptions or thickness differences to occur in the metal layer during the deformation is slight.

A relatively simple shield advantageously comprises a substantially box-shaped element (also known as a shielding cap), the side wall(s) of which is/are provided with a projecting edge extending parallel to the main surface of the PCB, preferably an outward extending side edge with a view to the prior deformation. The box-shaped element may be a round, rectangular or square container, or may have any other suitable appearance. Such a box-shaped element is easy to position on and fix to the PCB by means of existing devices, for example the so-called pick-and-place machines, robot-type machines which are capable of placing the correct components in the correct positions, and which are already in use for positioning electronic components in the correct position on the PCB.

Steps a) and b) are advantageously carried out by means of the already mentioned pick-and-place machines, in the case of this first variant preferably with the same pick-and-place machine. In this way, a very simple assembly is possible, in fact consisting of 2 phases, involving positioning, on the one hand, and fixing, on the other hand.

In the case of the method discussed above, the shield is also exposed to a high temperature, so that the flowable, electrically conducting fixing agent begins to flow. The plastic of the metallized plastic film is therefore advantageously a temperature-resistant material (preferably >260° C.), such as polyimide, PEI, PEEK, PES, polyamide and the like, or a mixture of these, if desired in combination with less temperature-resistant materials, such as PC. The deformation of the metallized plastic film in order to produce the shield in the desired shape from it is usually carried out at fairly high temperatures in the range between 100 and 300° C., in particular between 100 and 200° C. Thermoplastic plastics are therefore particularly suitable. A preferred material for the plastic film is polyimide, on account of its good temperature resistance and deformation properties. Polyimide also has properties that are beneficial for the metallization itself. The application of the thin metal layer to the plastic substrate for producing the metallized plastic film can be carried out by, for example, magnetron sputtering, thermal vacuum metallization, electroless plating and the like. Polyimide does not exhibit any evaporation phenomena of monomer material from the polymer during vacuum processes. In the case of sputtering the plastic is preferably non-halogen-containing, since in a conventional sputter unit halogen-containing material generally behaves aggressively (corrosively). If the thin metal layer is deposited on the plastic substrate by means of plating methods, the plastic is advantageously resistant to chemicals, in particular to acids.

The metal of the metallized plastic film is advantageously selected from Sn, Ni, Cu, Pb, alloys and mixtures thereof. A preferred material comprises tin or a tin alloy, on account of the good deformation properties, as already recognized in the earlier mentioned publication WO-A-98/40770. The properties mentioned in that publication, such as thicknesses of the plastic film and the layer of tin deposited on it, if desired with the interposition of a thin intermediate layer which promotes adhesion, or with a corrosion-resistant top layer, are likewise usable in the case of the present invention.

An example of a suitable shielding material is a thermally stable polyimide film deformable under vacuum, with a layer of tin 5 (+/−0.5) μm thick, which has a resistance (as R per square) of 0.18 +/−0.3 ohm/square.

According to a further aspect, the invention relates to a method for the production of a board with printed circuit shielded against interfering radiation and having at least one electronic component, which method comprises the steps of a) the positioning and fixing of the at least one electronic component on contact points concerned of the board with printed circuit;
b) the positioning of a shield, comprising a preformed metallized plastic film, over the top of the at least one electronic component on the earth of the board with printed circuit, the shield being a substantially box-shaped element, the side wall of which is provided with a fixing edge extending parallel to the main surface of the board, which fixing edge is provided with through apertures; and
c) the fixing of the shield on the earth of the board with printed circuit, using a fixing agent.

In the case of this variant of the method of the invention, in a first step the electronic components are placed on the appropriate contact points of the PCB and fixed, for example with solder or conducting polymer. The shield is then placed over the top of the components thus positioned and is in electrically conducting contact with an earth track present on the PCB. In the case of this method the shield used is made of a plastic substrate that is first metallized and is then deformed to a shape desired for the shield. Such a shield has the advantages mentioned earlier. In the case of this variant of the method the shield is produced in the shape of a substantially box-shaped element. Such a box-shaped element comprises a bottom, vertical side walls and an open top side. On the edges bounding the top side, the vertical side walls are provided with fixing edges generally extending perpendicularly to the side walls and facing outwards. In the fixed position, said fixing edges run parallel to the main surface of the PCB. Through apertures are provided in said fixing edges, which apertures can act as parts for fixing the shield on the earth of the PCB. In a simple embodiment, adhesive tape which may or may not be conducting is used. Such adhesive tape comprises a (plastic) carrier, which is provided with an adhesive layer on at least one side. The carrier can also comprise a plastic foam, such as polyurethane foam, in particular polyurethane foam based on polyether chains, on account of the compressibility and adaptability. The (single-sided) adhesive tape, which may or may not be conducting, is placed at least partially on the side of the fixing edge facing away from the PCB, and partially on the board with printed circuit by way of the apertures. A flowable fixing agent, such as solder and conducting polymer, can also be used in the apertures. Other examples of such a fixing agent comprise a mechanical fixing agent such as clips and the like, interacting with holes or other fixing facilities provided in the board with printed circuit. The use of adhesive tape permits simple assembly.

A thermoplastic plastic can also be provided in the through apertures, which thermoplastic plastic flows when there is a temperature increase and hardens when there is cooling, in order to produce a connection between shield and board. It is important in that case for direct electrical contact to exist between the metal of the shield and the metal on the board. Direct electrical contact gives better conductance, and thus better protection. It also gives great durability.

The pick-and-place machines mentioned earlier can be used for carrying out the positioning of the electronic components and the shield. With regard to the type of starting materials for the shield, namely the plastic and metal covering, and also the production techniques used, reference is made to the discussion of these given above. Temperature resistance of the shield plays a subordinate role here.

In yet a further variant of the method for the production of a board with printed circuit shielded with a shield against interfering radiation and having at least one electronic component, said method comprises the steps of
a) the positioning and fixing of the at least one electronic component on contact points concerned of the board with printed circuit;
b) the positioning of a shield, comprising a preformed metallized plastic film, over the at least one electronic component on the earth of the board with printed circuit; and
c) the fixing of the shield on the earth of the board with printed circuit, using a conducting, double-sided adhesive material, the adhesion strength of the conducting, double-sided adhesive material to the shield being greater than its adhesion strength to the earth of the board with printed circuit.

In the case of this variant the fixing of the shield is carried out using a conducting double-sided adhesive material, after the electronic components have first been positioned on and fixed to, for example soldered on, the PCB. Since in the case of this variant the shielding material itself is not exposed to the high soldering temperatures, the requirements to be laid down for the shielding material as regards temperature resistance are lower. For example, PC can be used. Of course, the plastic materials mentioned above in the case of the first variant can also be used. The metal of the shielding material can be selected from the metals or their alloys already mentioned. In addition, the use of double-sided adhesive tape which is conducting has the advantage that disassembly, for example for repair or recycling work, is relatively easy to carry out. The adhesion strength of the adhesive material in strip form to the shield is greater than its adhesion strength to the PCB, for example by applying a different adhesive layer on either side to a suitable strip-shaped substrate. The adjustment of the adhesion strength by means of an adhesion gradient in the thickness direction of the adhesive layer is likewise a possibility and is a procedure which is known in the art concerned. The strip-shaped adhesive material is further advantageously applied to the fixing edges of the box-shaped element, prior to the positioning of the shield on the PCB, because this is simpler than applying the strip-shaped adhesive material to the PCB, which is more difficult to gain access to it after the electronic components have already been fixed on it.

An example of a suitable conducting, strip-shaped double-sided adhesive material is an acrylic polymer containing a conducting metal, the conducting metal advantageously being selected from silver, nickel, copper, alloys and mixtures thereof; for example, with a thickness of approximately 0.05 mm, an elongation of approximately 21%, and a resistance of less than 0.02 ohm/inch.

BRIEF DESCRIPTION OF THE DRAWINGS

The invention is explained below with reference to the appended drawing, in which.

DETAILED DESCRIPTION OF THE INVENTION

Figure 1:
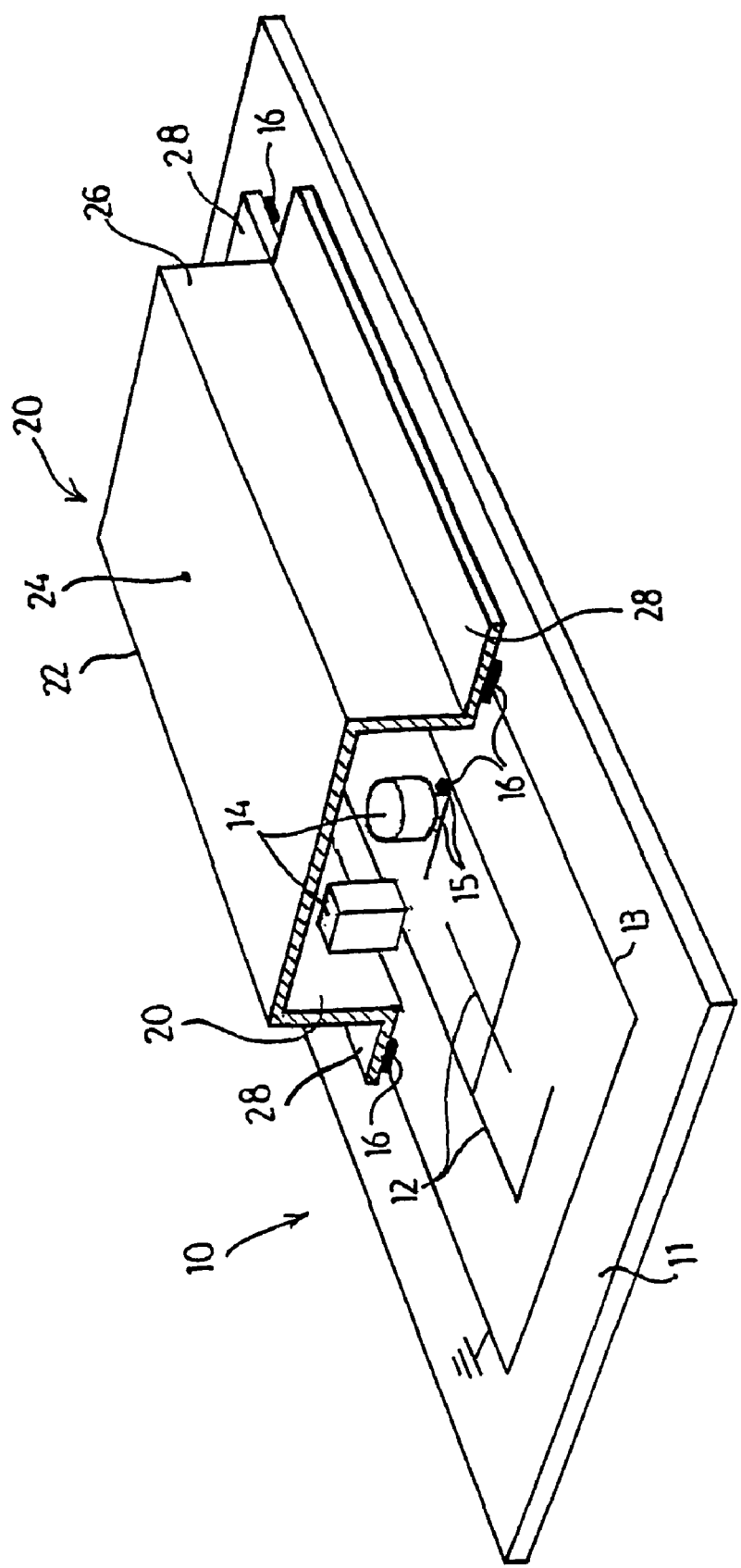
FIG. 1 is a cross-sectional view of a first embodiment of a PCB with a shield acting against interfering radiation.

FIG. 1 shows a cross section of a first embodiment of a PCB shielded against interfering radiation, indicated in its entirety by reference numeral 10. Said PCB 10 comprises a rectangular carrier 11, on which a system of electrical conductors 12 is provided as the printed circuit, which conductors are applied or printed in a manner that is usual in the art. A separate earth track 13 is further provided. Electronic components 14 are provided at predetermined positions, here also called contact points 15, which components are fixed by means of solder 16 and are thus in contact with the conductors 12. A shield 20 is provided on the PCB 10, in the embodiment shown said shield comprising a box 22 with a bottom 24 and side walls 26. At the open top side of the box 22, the side walls 26 are provided with outward extending fixing edges 28. The box 22 is formed from a metallized plastic film 30 by deep drawing at raised temperature, which film in the case illustrated comprises a metal layer 32 facing the PCB and a plastic substrate 34 (see FIG. 2), for example a tin-plated polyimide film. If desired, a plastic film metallized on both sides can be used. The metal layer 32 is connected in a conducting manner to the earth track 13 by means of solder 16.

Figure 2:
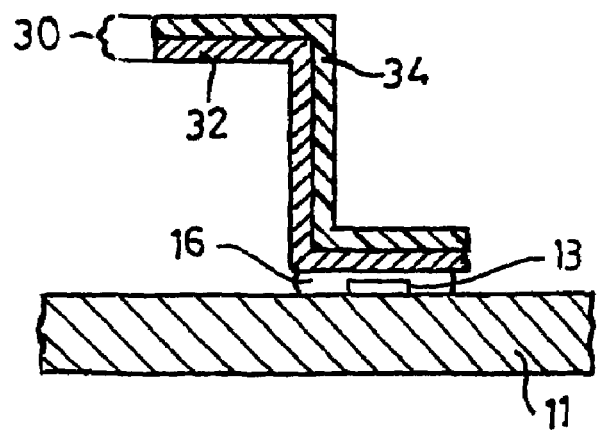
FIG. 2 is a cross section of a detail of a soldered connection between PCB and shield in FIG. 1.

The embodiment illustrated in FIGS. 1 and 2 is made as follows. A small quantity of solid solder 16 is applied to the contact points 15 on the board 11 with network of conductors 12 and a separate earth track 13, and to various contact positions on the earth track 13 for the shield 20. The electrical components 14 are then positioned on the contact points 15—for example, projecting contacts of the components 14 in corresponding recesses of the contact points. The shield 20 is subsequently positioned over the top of the electrical components 14. Both positioning steps are carried out with the same pick-and-place machine. The assembly thus prepared is placed in an oven and heated to above the flowing point of the solder 16. Both the components 14 and the shield are fixed firmly to the PCB 10 by allowing the solder to flow and subsequently cool.

FIG. 2 shows in greater detail the soldered connection thus formed between the earth track 13 and the shield 20 using solder 16.

Figure 3:
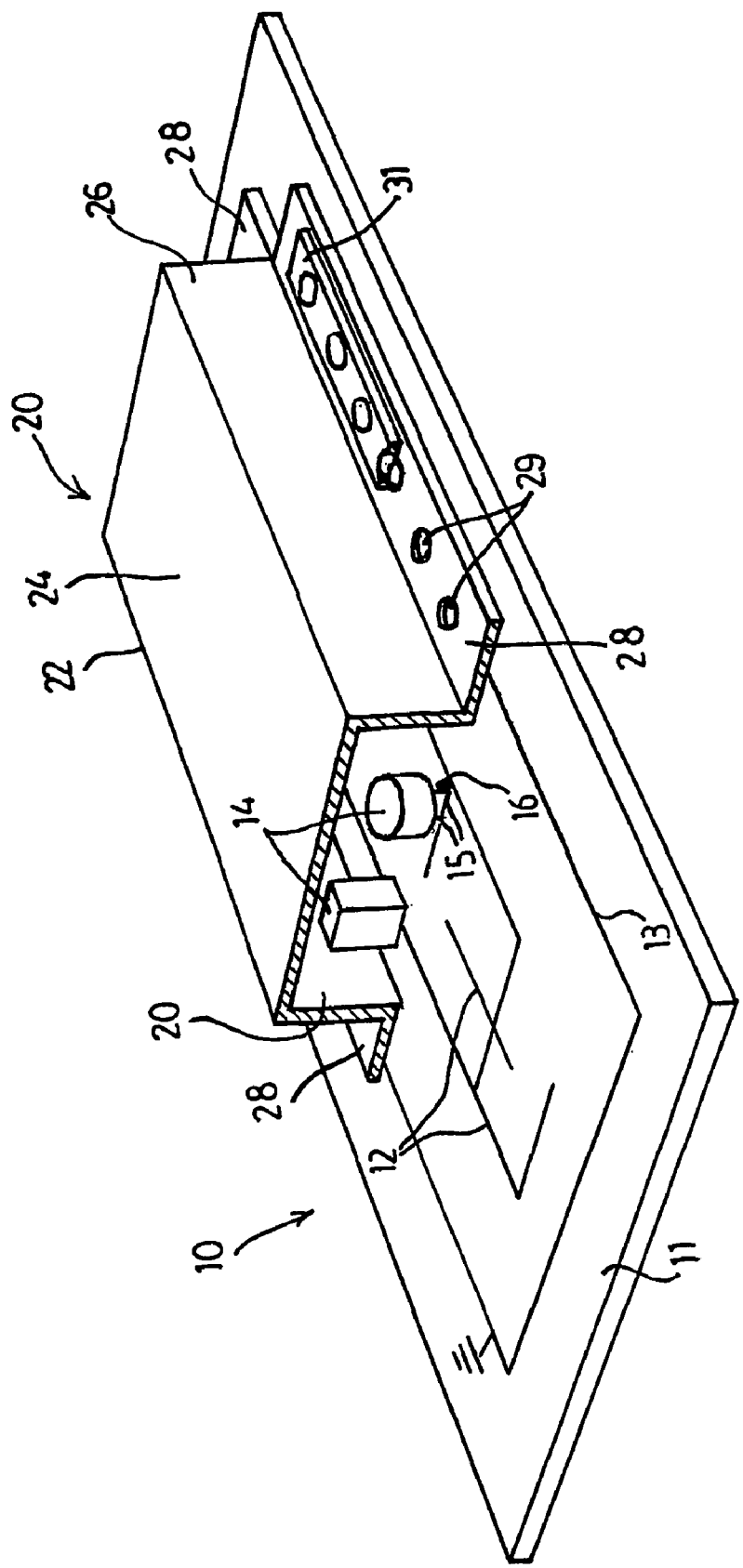
FIG. 3 is a cross-sectional view of a second embodiment of a PCB with a shield acting against interfering radiation.

FIG. 3 shows another embodiment of a PCB shielded against interfering radiation. In this figure components corresponding to components from FIGS. 1–2 are indicated by the same reference numerals. This embodiment of PCB 10 comprises a rectangular carrier 11, on which a system of electrical conductors 12 is provided as the printed circuit, which conductors are applied or printed in a manner usual in the art. A separate earth track 13 is further provided. Electronic components 14 are provided at predetermined positions, the contact points 15, which components are fixed by means of solder 16, and are thus in contact with the conductors 12. A shield 20 is provided on the PCB 10, which shield in the embodiment shown comprises a box 22 with a bottom 24 and side walls 26. On the open top side of the box 22, the side walls 26 are provided with outward extending fixing edges 28. The box 22 is formed by deep drawing at raised temperature from a metallized plastic film 30, which in the instance shown comprises a metal layer 32 facing the PCB and a plastic substrate 34 (see FIG. 4), for example a tin-plated polyimide film. If desired, a plastic film metallized on both sides can be used. A number of through apertures 29 are made in the fixing edge, and a single-sided adhesive tape strip 31 is provided on the fixing edge 28, which adhesive tape is forced through the apertures 29 until it is in contact with the board 11. This means that the fixing requires little surface area of the carrier 11. The metal layer 32 in this way is in direct contact with the earth track 13, as can be seen in greater detail from the cross section according to FIG. 4.

Figure 4:
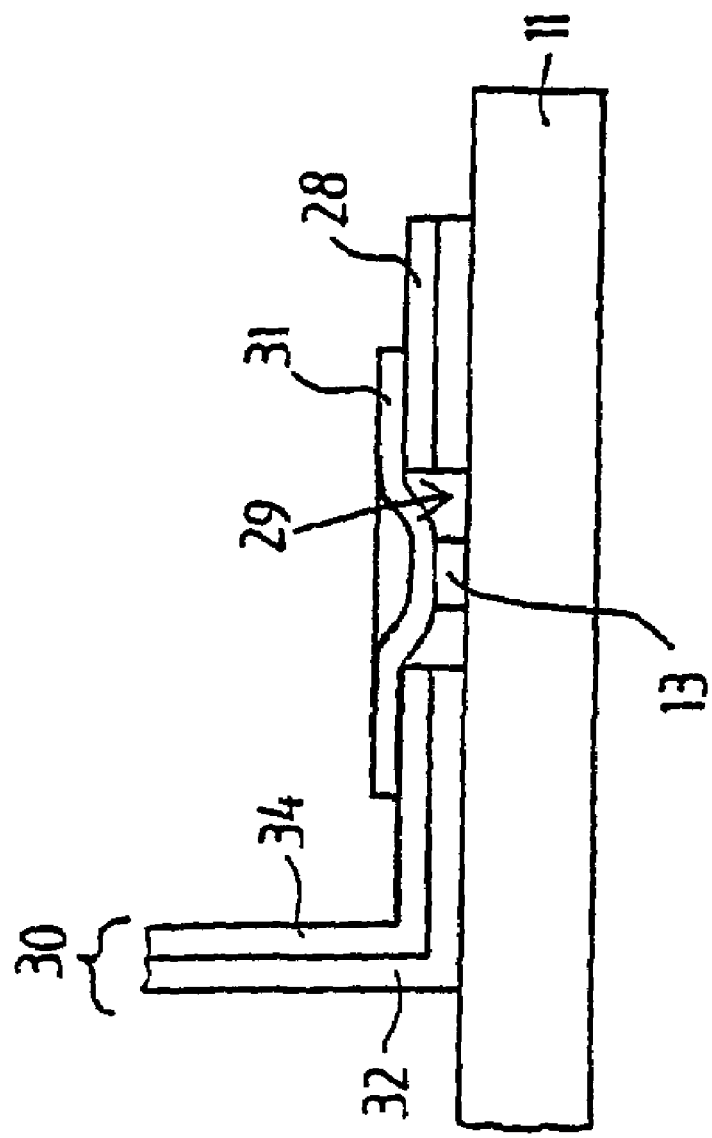
FIG. 4 is a cross section of a detail of the connection between PCB and shield in FIG. 3.

The embodiment illustrated in FIGS. 3 and 4 is made as follows. The electrical components 14 are positioned on the contact points 15 on the board 11 with network of conductors 12 and a separate earth track 13—for example, projecting contacts of the components 14 in corresponding recesses of the contact points—and soldered with solder 16. The shield 20 is then positioned over the top of the electrical components 14, and fixed with the single-sided adhesive tape 31 through the apertures 29. If the shield 20 and adhesive tape 31 are resistant to high temperature, if desired the soldering step of the components 14 can be carried out after positioning of both the components 14 and the shield 14, for example by heating in an oven to above the flowing point of the solder 16 and allowing to cool down. In that case it is easy to carry out both positioning steps with the same pick-and-place machine.

FIG. 4 shows in greater detail the electrical connection between the earth track 13 and the shield 20 when the single-sided adhesive tape 31 is used.

Figure 6:
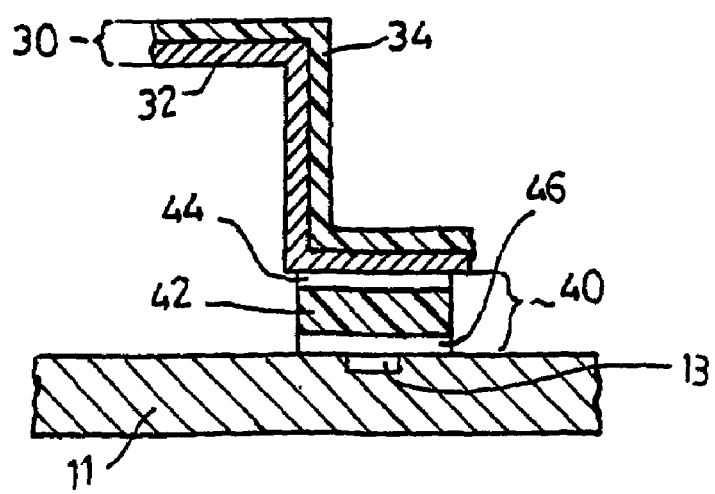
FIG. 6 is a cross section of a detail of the connection between PCB and shield in FIG. 3.
Figure 5:
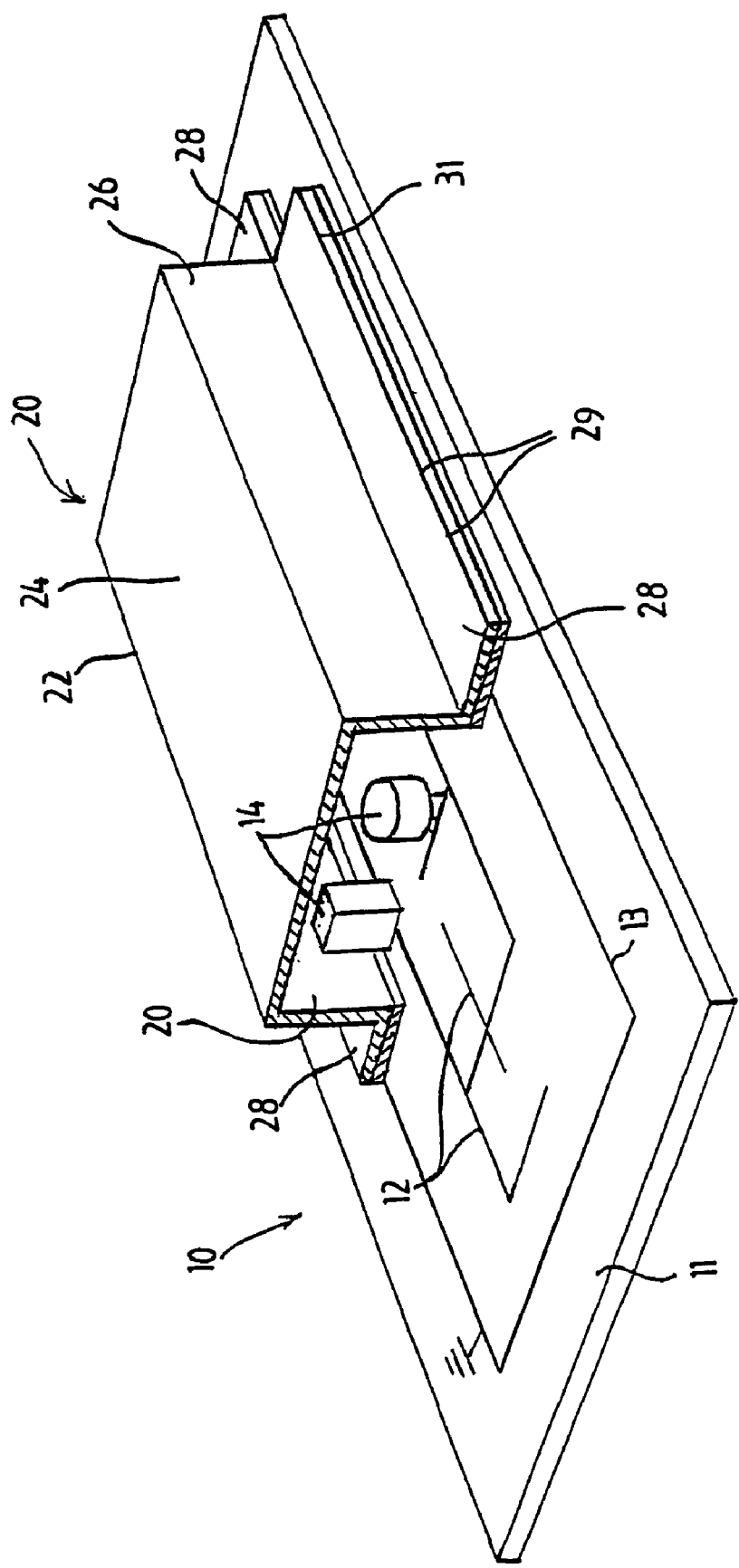
FIG. 5 is a cross-sectional view of a third embodiment of a PCB with a shield acting against interfering radiation.

FIG. 5 shows yet another embodiment of a PCB 10 shielded against interfering radiation. In this figure parts corresponding to parts from FIGS. 1–2 are indicated by the same reference numerals. This embodiment of PCB 10 comprises a rectangular carrier 11, on which a system of electrical conductors 12 is provided as the printed circuit, which conductors are placed or printed in a manner usual in the art. A separate earth track 13 is further provided. Electronic components 14 are provided at predetermined positions, the contact points 15, which are fixed by means of solder 16 and are thus in contact with the conductors 12. A shield 20 is provided on the PCB 10, which shield in the embodiment illustrated comprises a box 22 with bottom 24 and side walls 26. On the open top side of box 22 the side walls 26 are provided with outward extending fixing edges 28. The box 22 is formed from a metallized plastic film 30 by deep drawing at raised temperature, which film in the case illustrated comprises a metal layer 32 facing the PCB and a plastic substrate 34 (see also FIG. 7), for example a tin-plated polyimide film. If desired, a plastic film metallized on both sides can be used. Strips of a conducting, double-sided adhesive tape 40 (see FIG. 6) are provided on the fixing edges 28 of the box 22. After cooling of the assembly of PCB 10 and components 14, the box 22 prepared in this way is positioned by means of a pick-and-place machine at its intended position and adhered.

The adhesive tape 40 is composed of a carrier layer 42 with a conducting adhesive layer 44, 46 respectively on either side, each layer having its own adhesion strength, as explained above. The adhesive tape can also be made of a conducting adhesive matrix containing metal particles, which in the thickness direction is provided with an adhesion gradient, so that its two surfaces have a different adhesion on the earth track 13 and the carrier 11, and the shield 20 respectively.

What is claimed is:

1. Method for the production of a board with printed circuit shielded against interfering radiation and having at least one electronic component, which method comprises the following steps:
   a) the positioning and fixing of the at least one electronic component on contact points concerned of the board with printed circuit;
   b) the positioning of a shield, comprising a preformed metallized plastic film, over the top of the electronic component on the earth of the board with printed circuit, the shield being a substantially box-shaped element, the side wall of which is provided with a fixing edge extending parallel to the main surface of the board, which fixing edge is provided with through apertures; and
   c) the fixing of the shield on the earth of the board with printed circuit by applying a fixing agent over the fixing edge and on the board with printed circuit by way of the apertures.

2. Method according to claim 1, wherein the fixing agent is single-sided adhesive tape.

3. Method according to claim 1, wherein the steps a) and b) are carried out with a so-called pick-and-place device.

4. Method according to claim 1, wherein the plastic of the metallized plastic film is a temperature-resistant materials.

5. Method according to claim 4, wherein the temperature-resistant material is selected from a group consisting of polyimide, PC, PEEK, PES, polyamide or mixtures thereof.

6. Method according to claim 1, wherein the metal of the metallized plastic film is selected from Sn, Ni, Cu, Pb, alloys and mixtures thereof.

7. Method according to claim 6, wherein the metal comprises tin, lead or an alloy thereof.

* * * * *